United States Patent
Runkle

(10) Patent No.: US 6,214,177 B1
(45) Date of Patent: Apr. 10, 2001

(54) METHOD OF PRODUCING A SILICON/ALUMINUM SPUTTERING TARGET

(75) Inventor: Joseph C. Runkle, Manchester-by-the-Sea, MA (US)

(73) Assignee: Ultraclad Corporation, Andover, MA (US)

( * ) Notice: Subject to any disclaimer, the term of this patent is extended or adjusted under 35 U.S.C. 154(b) by 0 days.

(21) Appl. No.: 09/470,059

(22) Filed: Dec. 22, 1999

Related U.S. Application Data

(60) Provisional application No. 60/113,920, filed on Dec. 28, 1998.

(51) Int. Cl.$^7$ ................. B22F 3/15; B22F 3/16; C23C 14/10; C23C 14/14; C23C 14/34
(52) U.S. Cl. ............... 204/192.15; 204/192.12; 204/192.16; 204/192.17; 204/192.23; 204/298.12; 204/298.13; 419/2; 419/10; 419/23; 419/31; 419/32; 419/29; 419/42; 419/47; 419/48; 419/49; 428/428; 428/433; 428/457; 428/539.5; 428/689; 264/42; 264/43; 264/56; 420/578
(58) Field of Search ............ 204/192.12, 192.15, 204/192.16, 192.17, 192.23, 298.12, 298.13; 419/2, 10, 23, 31, 32, 29, 42, 47, 48, 49; 264/42, 43, 500, 56; 420/578; 428/428, 433, 457, 539.5, 689

(56) References Cited

U.S. PATENT DOCUMENTS

| | | |
|---|---|---|
| 4,731,116 | 3/1988 | Kny ................................ 75/238 |
| 4,808,455 | 2/1989 | Wada et al. . |
| 4,960,651 | 10/1990 | Pettigrew et al. . |
| 5,087,297 | 2/1992 | Pouliquen ................... 148/2 |
| 5,242,865 | 9/1993 | Nagase et al. ............ 501/1 |
| 5,342,571 | 8/1994 | Dittmar et al. ............ 419/13 |
| 5,403,458 | 4/1995 | Hartig et al. .......... 204/192.15 |

FOREIGN PATENT DOCUMENTS

| | | |
|---|---|---|
| 4184732 | 7/1992 | (JP) . |
| 5-331635 | * 12/1993 | (JP) . |
| 6-299343 | * 10/1994 | (JP) . |

OTHER PUBLICATIONS

SISPA ™ *Silicon Alloy Targets for Reactive $Si_3N_4/SiO_2$ Coatings*, Leybold Materials Inc. (Date Unknown).

* cited by examiner

*Primary Examiner*—Alan Diamond
(74) *Attorney, Agent, or Firm*—Nutter, McClennen & Fish, LLP

(57) ABSTRACT

A method of producing a silicon aluminum sputtering target is provided. The target is formed from a powder base of between about 80% to about 95% by weight silicon and about 5% to about 20% by weight aluminum which is placed in a containment unit, heated under vacuum and then sealed. The base is then subjected to a pressure greater than about 3000 psi and heated to a temperature between about 1076° F. and about 1652° F. such that some, but not more than 30%, of the resulting target is formed from liquid phase silicon-aluminum.

39 Claims, 2 Drawing Sheets

METHOD OF PRODUCING A SILICON/ALUMINUM SPUTTERING TARGET

CROSS-REFERENCE TO RELATED APPLICATIONS

This application claims priority from U.S. Provisional Patent Application Ser. No. 60/113,920, filed on Dec. 28, 1998, which is expressly incorporated by reference herein,

STATEMENT REGARDING FEDERALLY-SPONSORED RESEARCH

Not applicable.

FIELD OF THE INVENTION

The invention relates generally to target materials used in sputtering processes, and more particularly to a method of preparing a target material for use in sputtering processes to coat glass.

BACKGROUND OF THE INVENTION

Sputtering is an electric discharge process used to synthesize materials while imparting certain characteristics thereto. For example, sputtering may be used to synthesize glass while, concurrently, providing the glass with characteristics such as emissivity, reflectivity, transmittance, chemical resistance or color.

During the sputtering process, gas ions bombard a target having a face formed of a desired material that is to be deposited or coated as a thin film or layer on a substrate. The ion bombardment of the target causes atoms or molecules of the target material to be ejected (or "sputtered") onto the substrate to synthesize a material. The target may be specifically selected in view of the material to be synthesized and the characteristics to be provided to the synthesized material.

Silicon-aluminum alloys are often used as targets in sputtering processes to synthesize glass because the addition of the aluminum advantageously increases the electrical conductivity of the silicon. But, current methods for preparing such silicon-aluminum targets frequently result in targets that have several shortcomings which translate into serious drawbacks in glass synthesized using those targets.

Conventional silicon-aluminum targets are prepared by vacuum casting methods in which the targets are solidified from a 100% liquid state. This preparation technique results in target materials having certain undesirable characteristics such as grain size control difficulty, heterogeneity, or segregation. In turn, glass sputter-coated using these targets tends to have defects visible in the coating, thus rendering the glass useless.

A characteristic that is particularly undesirable, yet also difficult to avoid during vacuum-casting preparation of a silicon-aluminum target, is residual porosity at the center of the target. A sputtering process that is carried out with a silicon-aluminum target having a residual porosity of as little as 0.5 millimeters in diameter at the center of the target could cause electrical arcing during the sputtering process. In turn, glass sputter-coated using a silicon-aluminum target with residual porosity, has a reduced yield, and exhibits visible defects in the coating.

It would, therefore, be desirable to provide a silicon-aluminum sputtering target and a method for fabricating such a target, which provide certain enhanced characteristics to glass sputter-coated using the target.

SUMMARY OF THE INVENTION

The present invention provides a silicon-aluminum sputtering target and a method for producing such a target. Although the invention is primarily shown and described with reference to a method for preparing a silicon-aluminum sputtering target for use in the synthesis of glass, it is understood that the method has other applications as well.

In one embodiment, a powder base of silicon and aluminum metallic precursors are blended together. The blended base is placed in a metal containment unit which is heated under vacuum to eliminate a predetermined amount of residual moisture. The containment unit is then sealed and placed in a treatment unit. The silicon-aluminum base is heated and pressurized in the treatment unit until it is consolidated and sufficiently densified so as to form a silicon-aluminum sputtering target for use in synthesizing glass.

The powder base preferably includes between about 80% to about 95% silicon and about 5% to about 20% aluminum. The heating and pressurization of the powder base preferably occurs in a hot isostatic press at a pressure greater than about 3000 psi and at a temperature above about 580° C. (1076° F.), the silicon-aluminum eutectic melting point, but below about 815° C. (1500° F.). This temperature range prevents more than 30% liquid phase silicon-aluminum from being present during the preparation of the silicon-aluminum target, but also allows for sufficient liquid phase to be present in order to effect densification. By limiting the amount of liquid phase silicon-aluminum therein, the target has reduced residual porosity, has a substantially uniform chemistry, and is not brittle. The target, in turn, provides certain enhanced characteristics to glass that is sputter-coated using the target.

BRIEF DESCRIPTION OF THE DRAWINGS

A more complete understanding of the present invention and the attendant advantages and features thereof will be more readily understood by reference to the following detailed description when it is considered in conjunction with the accompanying drawings, wherein.

DETAILED DESCRIPTION OF THE INVENTION

The present invention provides a silicon-aluminum target for use in a sputtering process to synthesize glass. The target is prepared such that it provides certain enhanced characteristics to glass coating synthesized using the target.

Figure 1:
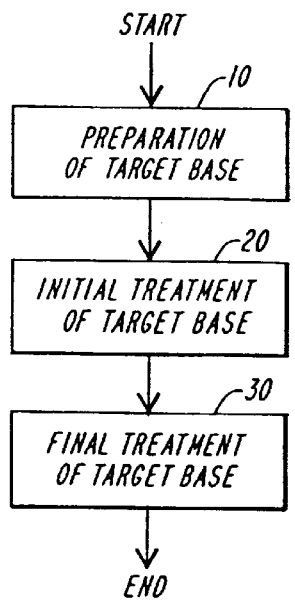
FIG. 1 is a flow diagram of a process for producing a silicon-aluminum target in accordance with the present invention.

FIG. 1 shows a process of making such a silicon-aluminum target. In process step 10, a target base is prepared from pure silicon and pure aluminum metallic precursors. The base is blended so as to have a predetermined composition of silicon and aluminum.

In an exemplary embodiment, the target base will contain between about 80% and about 95% silicon by weight and between about 5% and about 20% of aluminum by weight, each of which are in powder form. The powder base is blended together as is generally known in the art until it has a mesh size of between about 75 mesh and about 125 mesh. In one embodiment, the target base contains about 90% silicon powder by weight and about 10% aluminum powder by weight and is blended until the powders have a mesh size of about 100 mesh.

Once the powder base has been sufficiently blended, it is treated according to process step 20. During process step 20, the blended powder base is placed in a containment unit where it is heated and then sealed. In an exemplary embodiment, the blended powder base is placed in metal or glass containment unit capable of withstanding temperatures between 0° F. to at least about 1850° F. The base is heated until the residual moisture of the powders has been eliminated, after which the containment unit is sealed, such as by crimp welding.

The containment unit should be made of a material that is capable of effecting an hermetic seal, and that is capable of plastically flowing at the hot isostatic pressure consolidation temperature. Examples of such materials include, but are not limited to, glass, steel, stainless steel, and other weldable ductile metals. Further, the envelope is preferably heated under vacuum and then hermetically sealed.

The sealed envelope containing the silicon-aluminum target base is further treated in accordance with treatment process step 30. During step 30, the base is subjected to predetermined pressure and heat levels such that some liquid phase silicon-aluminum is present in the resulting target material. Generally, the sealed envelope is placed in a treatment unit where it is both heated and pressurized. One of ordinary skill in the art, however, will readily appreciate that the heating and pressurizing of the silicon-aluminum base may occur in separate treatment units. The treatment unit is pressurized with a gas to a pressure greater than about 3000 psi and heated to a temperature of between about 580° C. (1076° F.) and about 900° C. (1652° F.). The pressurizing may occur either before, during, or after the heating of the envelope.

In a preferred embodiment, the treatment unit is a hot isostatic press that is pressurized to a predetermined pressure level with argon gas. The hot isostatic press is heated as is generally known in the art to about 649° C. (1200° F.) to produce a silicon-aluminum target material that is substantially completely densified. As used herein, "completely densified" refers to a silicon-aluminum target material that is free of residual porosity greater than 4% by volume, and that preferably has a residual porosity less than 1% by volume. Moreover, the silicon-aluminum target material should also be fine-grained, such that the grain size is approximately equal to the starting size of the Aluminum powder. In one embodiment, the grain size is less than or equal to about 150 micrometers in diameter, and preferably less than about 100 micrometers in diameter. Also, the resulting silicon-aluminum target material will generally contain less than 30% liquid phase silicon-aluminum.

Figure 2:
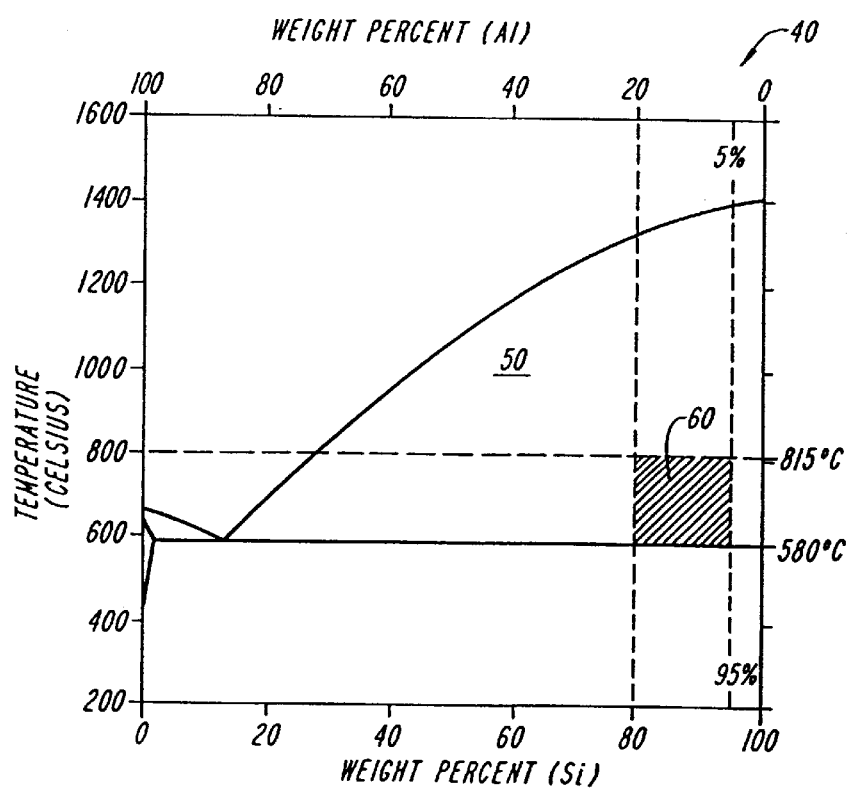
FIG. 2 is a binary phase diagram of silicon-aluminum with a preferred heating range and composition range indicated thereon.

Referring now to FIG. 2, a binary phase diagram 40 of silicon-aluminum is shown. The diagram 40 shows the various phases of a silicon-aluminum binary system. Included among these phases is a silicon-aluminum liquid phase 50. A shaded region 60 is contained within the silicon-aluminum liquid phase 50 and corresponds to both the compositions of silicon and aluminum that form the target base according to step 10 of the process of FIG. 1, and to the temperatures at which the silicon-aluminum base is heated in the treatment unit during step 30 of the process of FIG. 1.

The shaded region 60 is wholly contained within the silicon-aluminum liquid phase 50 of the diagram 40. As shown in FIG. 2, the silicon-aluminum liquid phase 50 corresponds to silicon-aluminum compounds that have compositions between about 15% and 100% silicon by weight, and that have temperatures between about 580° C. (1076° F.) and about 1420° C. (2588° F.). The amount of liquid phase silicon-aluminum in the area 50 is 0% at 580° C. (1076° F.), the eutectic temperature of silicon-aluminum, and increases with temperature as indicated in FIG. 2.

In general, it is beneficial to have some liquid phase silicon-aluminum present in the resulting silicon-aluminum target. Further, a silicon-aluminum target prepared in accordance with the method of FIG. 1, and within the ranges of the shaded region 60 of FIG. 2, will enhance the characteristics of glass coating synthesized using the target.

The composition range in the shaded region 60 corresponds to between about 80% to about 95% silicon by weight and about 5% to about 20% aluminum by weight. Such a composition range provides enough aluminum to increase the electrical conductivity of the silicon, while maintaining enough silicon to have a desired glass-like characteristics.

The temperature range in the shaded region 60 corresponds to between about 580° C. (1076° F.) and about 900° C. (1652° F.). It is believed that heating the treatment unit in a hot isostatic press below about 580° C., the silicon-aluminum eutectic temperature, does not allow for adequate bonding of the silicon and aluminum. In turn, a resulting silicon-aluminum target would likely contain excessive residual porosity and would, therefore, be relatively weak.

Further, heating the treatment unit in a hot isostatic press above about 815° C. would result in greater than 30% liquid phase silicon-aluminum present in the target. Experimentation has also shown that when greater than 30% liquid phase silicon-aluminum is present in a silicon-aluminum target, the target may have numerous potential shortcomings. Specifically, the microstructure of the target may be adversely affected in that the target would likely have a large grain size and a non-uniform chemistry (i.e., segregation). Also, the resulting target would likely be brittle. And, when greater than 30% liquid phase silicon-aluminum is used in the process of FIG. 1, the metal-based envelope containing the silicon-aluminum target base could erode which, in turn, may compromise the integrity of the seal of the envelope and result in loss of densification in the target.

Thus, in a preferred embodiment, a target base is formed from about 90% silicon by weight and about 10% aluminum by weight and is heated in a sealed envelope in a treatment unit to a temperature of about 649° C. (1200° F.) such that some, but less than 30%, liquid phase silicon-aluminum is present in a resulting silicon-aluminum target.

Figure 3:
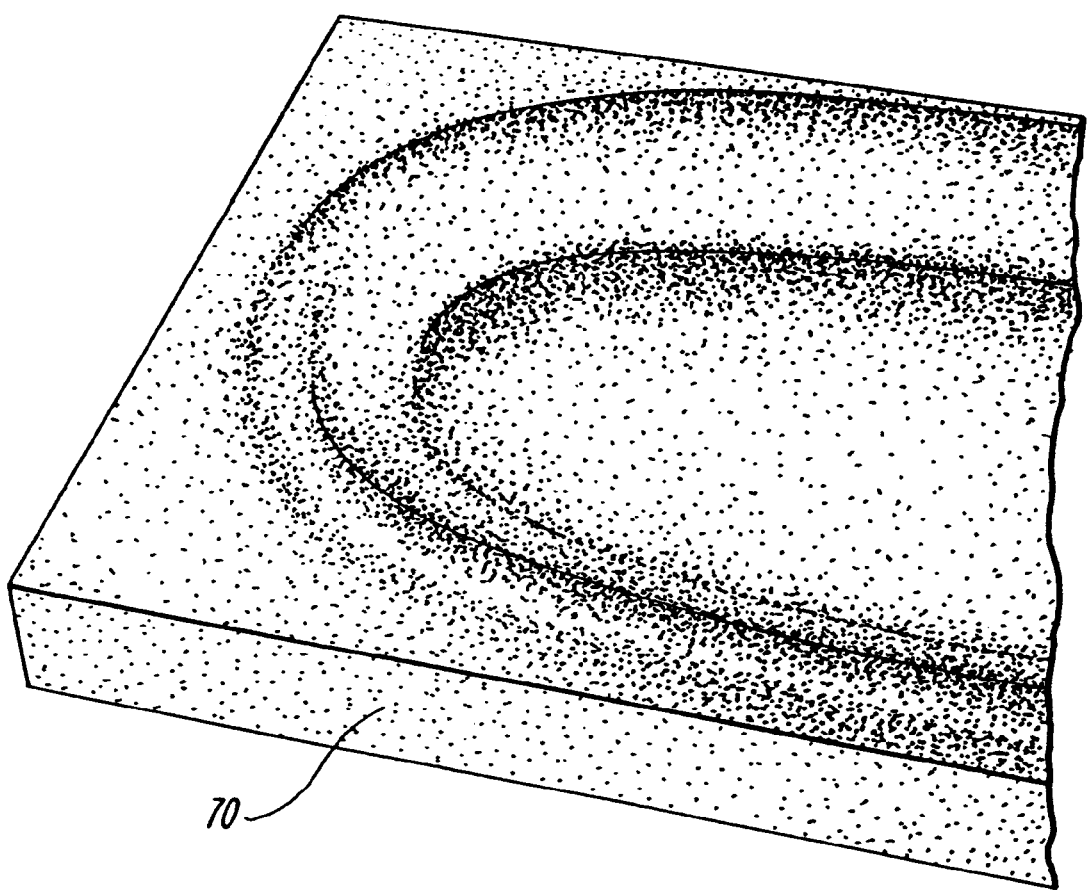
FIG. 3 is a sectional view of a Si-10% Al target prepared according to the flow diagram of FIG. 1.

Referring now to FIG. 3, an individual silicon-aluminum target 70 prepared in accordance with the method of FIG. 1 is shown. The target was prepared under conditions within the shaded region 60 of FIG. 2. Specifically, the target 70 was prepared from a base of 90% silicon by weight and 10% aluminum by weight. The base was then placed in a steel envelope and heated under vacuum until all or substantially all of the residual moisture of the base was eliminated. The envelope was then placed in a hot isostatic press which was heated to about 649° C. (1200° F.) and pressurized to about 3000 psi with argon gas.

The above-described process can be used to produce a block of silicon-aluminum target material. This block may be cut or otherwise divided into individual silicon-aluminum target materials, such as that shown in FIG. 3, so that each individual silicon-aluminum target material has the same or substantially the same properties. Each individual silicon-aluminum target should be substantially free of voids and inclusions, should have a fine grain size, should have a porosity of less than 4% by volume, and should preferably have no individual pores larger than 100 micrometers diameter. The target provides certain enhanced characteristics to glass synthesized using the target.

Although the invention has been shown and described with respect to exemplary embodiments thereof, various other changes, omissions and additions in form and detail thereof may be made therein without departing from the spirit and scope of the invention. All references and publications cited herein are expressly incorporated herein by reference in their entirety.

What is claimed is:

1. A method of producing a sputtering target, comprising:
   providing a powder base of between about 80% to about 95% by weight silicon and about 5% to about 20% by weight aluminum;
   placing the powder base in a containment unit;
   sealing the containment unit;
   subjecting the containment unit to a pressure greater than about 3000 psi; and
   heating the containment unit to a temperature between 1076° F. and about 1652° F. such that at least some liquid phase silicon-aluminum is present in the sputtering target.

2. The method of claim 1, wherein the powder base comprises about 90% by weight silicon.

3. The method of claim 1, wherein the powder base comprises about 10% by weight aluminum.

4. The method of claim 1, further comprising the step of:
   blending the powder base prior to the step of placing the powder base in a containment unit.

5. The method of claim 4, wherein the step of blending the powder base is performed until the powder base has a mesh size of between about 75 mesh and 125 mesh.

6. The method of claim 1, wherein the step of placing the powder in a containment unit further includes subsequently heating the containment unit.

7. The method of claim 1, wherein the step of sealing the containment unit comprises hermetically sealing the containment unit.

8. The method of claim 1, wherein the containment unit is made of a metal-based material.

9. The method of claim 8, wherein the metal-based material is selected from the group consisting of steel and stainless steel.

10. The method of claim 1, wherein the containment unit is made of glass.

11. The method of claim 1, wherein the steps of subjecting the containment unit to a pressure greater than about 3000 psi and heating the containment unit to a temperature between about 1076° F. and about 1652° F. are both performed in one treatment unit.

12. The method of claim 1, wherein the steps of subjecting the containment unit to a pressure greater than about 3000 psi and heating the containment unit to a temperature between about 1076° F. and about 1652° F. are performed in a hot isostatic press.

13. The method of claim 1, wherein the steps of subjecting the containment unit to a pressure greater than about 3000 psi and heating the containment unit to a temperature between about 1076° F. and about 1652° F. are performed substantially simultaneously.

14. A sputtering target produced in accordance with the method of claim 1.

15. The sputtering target of claim 14, wherein the target has a residual porosity less than about 4% by volume.

16. The sputtering target of claim 15, wherein the target has a residual porosity less than about 1% by volume.

17. The sputtering target of claim 14, wherein the target contains a plurality of pores, and wherein each pore has a diameter less than about 100 micrometers.

18. The sputtering target of claim 14, wherein the target contains less than about 30% liquid phase silicon-aluminum.

19. A method of producing a sputtering target, comprising:
   providing a powder base of between about 80% to about 95% by weight silicon and about 5% to about 20% by weight aluminum;
   placing the powder base in a containment unit;
   sealing the containment unit;
   subjecting the containment unit to a pressure of at least about 3000 psi; and
   heating the containment unit until the silicon-aluminum eutectic melting point is exceeded and such that an amount of liquid phase silicon aluminum is present in the sputtering target, the amount being less than about 30% liquid phase silicon-aluminum.

20. The method of claim 19, wherein the powder base comprises about 90% by weight silicon.

21. The method of claim 19, wherein the powder base comprises about 10% by weight aluminum.

22. The method of claim 19, further comprising the step of:
   blending the powder base prior to the step of placing the powder base in a containment unit.

23. The method of claim 22, wherein the step of blending the powder base is performed until the powder base has a mesh size of between about 75 mesh and 125 mesh.

24. The method of claim 19, wherein the step of placing the powder in a containment unit further includes subsequently heating the containment unit and then hermetically sealing the containment unit.

25. The method of claim 19, wherein the containment unit is made of a metal-based material.

26. The method of claim 25, wherein the metal-based material is selected from the group consisting of steel and stainless steel.

27. The method of claim 19, wherein the containment unit is made of glass.

28. The method of claim 19, wherein the steps of subjecting the containment unit to a pressure of at least about 3000 psi and heating the containment unit until the silicon-aluminum eutectic melting point is exceeded and less than about 30% liquid phase silicon-aluminum is present are both performed in one treatment unit.

29. The method of claim 19, wherein the steps of subjecting the containment unit to a pressure of at least about 3000 psi and heating the containment unit until the silicon-aluminum eutectic melting point is exceeded and less than about 30%liquid phase silicon-aluminum is present are performed in a hot isostatic press.

30. The method of claim 19, wherein the step of heating the containment unit until the silicon-aluminum eutectic melting point is exceeded and less than about 30% liquid phase silicon-aluminum is present comprises heating the containment unit to a temperature between about 1076° F. and about 1652° F.

31. A sputtering target produced in accordance with the method of claim 19.

32. The sputtering target of claim 31, wherein the target has a residual porosity less than about 4.0% by volume.

33. The sputtering target of claim 31, wherein the target contains a plurality of pores, and wherein each pore has a diameter less than about 100 micrometers.

34. A method of sputtering, comprising:

provic a sputtering target by providing a powder base of between about 80% to about 95% by weight silicon and about 5% to about 20% by weight aluminum;

placing the powder base in a containment unit;

sealing the containment unit;

subjecting the containment unit to a pressure greater than about 3000 psi; and heating the containment unit to a temperature between 1076° F. and about 1652° F. such that at least some liquid phase silicon-aluminum is present in the sputtering target; and bombarding the target with ions such that a quantity of a first material effective to synthesize a second material is ejected from the target and deposited onto a substrate.

35. The method of claim 34, wherein the first material is a glass.

36. A sputtered material produced in accordance with the method of claim 34.

37. A method of sputtering, comprising:

providing a sputtering target according to the steps of:

providing a powder base of between about 80% to about 95% by weight silicon and about 5% to about 20% by weight aluminum;

placing the powder base in a containment unit;

sealing the containment unit;

subjecting the containment unit to a pressure greater than about 3000 psi; and heating the containment unit until the silicon-aluminum eutectic melting point is exceeded and such that an amount of liquid phase silicon aluminum is present in the sputtering target, the amount being less than about 30% liquid phase silicon-aluminum; and bombarding the target with ions such that a quantity of a first material effective to synthesize a second material is ejected from the target and deposited onto a substrate.

38. The method of claim 37, wherein the first material is a glass.

39. A sputtered material produced in accordance with the method of claim 37.

* * * * *